United States Patent [19]
Mehregany et al.

[11] Patent Number: 6,136,243
[45] Date of Patent: Oct. 24, 2000

[54] METHOD FOR MOLDING HIGH PRECISION COMPONENTS

[75] Inventors: Mehran Mehregany, Pepper Pike; Narayanan Rajan, Cleveland; Christian A. Zorman, Euclid, all of Ohio

[73] Assignee: Case Western Reserve University, Cleveland, Ohio

[21] Appl. No.: 09/090,526

[22] Filed: Jun. 4, 1998

[51] Int. Cl.$^7$ ............... B29C 41/08; B29C 33/52; C25F 3/02; C23F 1/02; C23F 1/04

[52] U.S. Cl. ............... 264/162; 264/81; 264/82; 264/219; 264/221; 264/317; 264/341; 216/2; 216/39; 216/47; 216/52; 216/99

[58] Field of Search ............... 264/81, 82, 219, 264/341, 162, 221, 317; 216/2, 11, 39, 47, 52, 53, 56, 99

[56] References Cited

U.S. PATENT DOCUMENTS

| | | | |
|---|---|---|---|
| 3,739,051 | 6/1973 | Smith | 264/48 |
| 4,127,629 | 11/1978 | Weaver et al. | 264/63 |
| 4,250,127 | 2/1981 | Warren et al. | 264/22 |
| 4,882,827 | 11/1989 | Kusumi et al. | 29/527.2 |
| 5,300,188 | 4/1994 | Tessmer et al. | 156/636 |
| 5,575,962 | 11/1996 | Takahashi | 264/2.5 |
| 5,580,827 | 12/1996 | Akamine | 437/225 |
| 5,600,880 | 2/1997 | Santini et al. | 29/603.14 |
| 5,635,337 | 6/1997 | Bartha et al. | 430/323 |
| 5,660,680 | 8/1997 | Keller | 438/50 |
| 6,033,581 | 3/2000 | Kobayashi | 216/27 |

OTHER PUBLICATIONS

Anders Olsson et al., "Valve–less diffuser micropumps fabricated using thermoplastic replication," *Sensors and Actuators*, A 64, pp. 63–68 (1998).

H. Bjorkman et al., "Diamond Microstructure Replicas from Silicon Masters," *Proceedings of IEEE*, The Eleventh Annual International Workshop on Micro Electro Mechanical Systems, (Jan. 25–29, 1998).

David A. Horsley et al., "Angular Micropositioner for Disk Drives," *Proceedings of IEEE MEMS*, pp. 454–459 (1977).

Takayuki Yagi et al., "A New Method to Fabricate Metal Tips for Scanning Probe Microscopy," Proceedings of IEEE MEMS, pp. 129–134 (1997).

N. Rajan et al., "3C–SiC Coating of Silicon Micromachined Atomizers," Proceedings of IEEE, The Tenth Annual International Workshop on Micro Electro Mechanical Systems, pp. 165–168 (Jan. 26–30, 1997).

Angad Singh et al., "Micromachined Silicon Fuel Atomizers for Gas Turbine Engines," Proceedings for IEEE, The Ninth Annual International Workshop on Micro Electro Mechanical Systems, pp. 473–478 (Feb. 11–15, 1996).

D. Sander et al., "Fabrication of Metallic Microstructures by Electroplating Using Deep–Etched Silicon Molds," *Journal of Microelectromechanical Systems*, vol. 4, No. 2, pp. 81–86 (Jun. 1995).

M.M. Farooqui and A.G.R. Evans, "Microfabrication of Submicron Nozzles in Silicon Nitride," *Journal of Microelectromechanical Systems*, vol. 1, No. 2, pp. 86–88 (Jun. 1992).

Prem Prakash et al., "Use of silicon oxynitride as a graphite mold releasing coating for the growth of shaped multicrystalline silicon crystals," *Journal of Crystal Growth*, vol. 144, Nos. 1 & 2, pp. 41–47 (Nov. 1994).

S.M. Spearing and K.S. Chen, "Micro–Gas Turbine Engine Materials and Structures," *Ceramic Engineering and Science Proceedings*, V. 18, No. 4, pp. 11–18 (1997).

*Primary Examiner*—Jan H. Silbaugh
*Assistant Examiner*—Michael I. Poe
*Attorney, Agent, or Firm*—Fay, Sharpe, Fagan, Minnich & McKee, LLP

[57] ABSTRACT

A method for molding high precision components is provided that allows inexpensive, rapid fabrication of components using a process involving a silicon substrate, in which the mold pattern is created using multiple mask layers, a deep reactive ion etch process and photolithographic patterning techniques.

8 Claims, 9 Drawing Sheets

METHOD FOR MOLDING HIGH PRECISION COMPONENTS

This invention was made with government support under Grant No. DAAH04-95-10097 awarded by the Army. The government has certain rights in this invention.

BACKGROUND OF THE INVENTION

This invention relates to a process for molding high precision components. More particularly, the invention is directed to a method of fabricating components, e.g. fuel atomizers for gas turbine engines, using a process in which a mold pattern is created using multiple masking layers, a deep reactive ion etching process and photolithographic patterning techniques. The invention also is directed to reusable molds.

While the invention is directed to the art of molding high precision components, and will be thus described with specific reference thereto, it will be appreciated that the invention may have usefulness in other fields and applications.

Generally, molding as a technology has existed for many years and has achieved a high degree of sophistication. Molding using silicon substrates, on the other hand, is a relatively new phenomenon. In the June, 1995 issue of the Journal of Microelectromechanical Systems, D. Sanders et al. reported the use of deep etched silicon molds in the article titled "Fabrication of metallic microstructures by electroplating using deep-etched silicon molds". However, it was a single pattern mold with only one etch step.

Further, it has been known to fabricate micromachined fuel atomizers from silicon (Si). The Si atomizers afford a high level of dimensional precision, which is lacking in both conventionally-machined and macrolaminated atomizers. However, under extremely erosive operational conditions, the Si atomizers suffer significant wear. While the development of hard coatings for these Si devices provided a solution for improving the wear resistance, there nonetheless remains a need for fabricating the complete atomizer from a material with high-temperature stability.

The fabrication of microelectromechanical systems (MEMS) devices from high-temperature materials has been hampered by the lack of processing technologies to effectively micromachine high-performance ceramics, like silicon carbide (SiC). While reactive ion etching (RIE) techniques have been developed to fabricate surface micromachined structures from SiC thin films, more complex three dimensional structures have not yet been realized. Excellent chemical stability/inertness of SiC significantly limits pattern delineation, depth and accuracy when utilizing etch processes.

Processes like Lithographie Galvanoformung Abformung (LIGA) provide the opportunity to fabricate micromachined devices from nickel (Ni), harnessing a material already used in the aerospace industry for its high-temperature characteristics and wear resistance in alloyed form. However, LIGA is not widely available and is often costly, driving the search for viable fabrication alternatives.

Other methods have sought to reduce cost by using UV (ultraviolet) sensitive photopolymers that allow molds of several hundred microns, but his method also suffers from lack of variation in the mold depth across the x-y plane of the mold.

The present invention contemplates a new and improved fabrication process for high precision components which resolves the above referenced difficulties and others.

SUMMARY OF THE INVENTION

A method of fabrication of high precision components is provided. The method involves the use of multiple mask layers on a substrate that are deposited and patterned before any etching takes place. The substrate is then etched to form a mold that is filled with a filler material, e.g. silicon carbide, to form a molded part.

A advantage of the present invention is that it uses a deep reactive ion etch to create molds with straight side walls and smooth surfaces.

According to one aspect of the present invention, to form the mold, the deepest etch is defined by the under-most masking layer, as it is used first, and then partially removed. The next etch is performed using the top-most masking layer (which has remaining portions of the undermost layer disposed thereunder) by etching the area of the substrate exposed after the exposed portions of the undermost layer are removed. It follows from the above description that the top-most masking layer exposes the substrate to be etched, as well as portions of the undermost masking layer.

According to another aspect of the present invention, to form the mold, the deepest etch is defined by the top-most masking layer, as it is used first, and then removed. The next etch is performed using the next masking layer, etching the area exposed by the first masking layer and the second masking layer. It follows from the above description that the top-most masking layer exposes the least amount of the substrate to be etched. It covers the other masking layer plus additional areas of the substrate that are exposed by the other masking layer.

According to another aspect of the present invention, the method provides molds that are reusable.

According to another aspect of the invention, the method includes the step of forming a thin layer of silicon carbide in the mold pattern before filling the mold pattern with silicon carbide to form the molded part.

Further scope of the applicability of the present invention will become apparent from the detailed description provided below. It should be understood, however, that the detailed description and specific examples, while indicating preferred embodiments of the invention, are given by way of illustration only, since various changes and modifications (for example, use of different materials and varying patterns) within the spirit and scope of the invention will become apparent to those skilled in the art.

DESCRIPTION OF THE DRAWINGS

The present invention exists in the construction, arrangement, and combination, of the various parts of the device and steps of the method, whereby the objects contemplated are obtained as hereinafter more fully set forth, specifically pointed out in the claims, and illustrated in the accompanying drawings in which:

DETAILED DESCRIPTION OF THE PREFERRED EMBODIMENTS

Briefly, the embodiments of the molding process hereinafter described differ from previous efforts on several levels.

For example, the present process uses multiple patterning layers to create a mold with dimensional variations on all three axes, as opposed to the conventional two axes. In addition, two patterning layers are used.

It is to be appreciated that the masking materials should be different because when the first masking layer is removed after the first etch, the second masking layer should still be intact. Further, although two masking patterns are used in the preferred embodiments, multiple masking patterns may be used as well, limited only by the availability of masking materials. Additional masking materials that can be used, in addition to those that will be described below, are silicon nitride and various metals that show significant selectivity in the deep reactive ion etch.

The approach is to deposit and pattern all etch masking layers before any of the etching takes place. In a first embodiment of the present invention illustrated in FIGS. 1(a)–(f), the deepest etch is defined by the undermost masking layer, as it is used first, and then partially removed. The next etch is performed using the top-most masking layer (which has remaining portions of the undermost layer disposed thereunder) by etching the area of the substrate exposed after the exposed portions of the undermost layer are removed. It follows from the above description that the top-most masking layer exposes the substrate to be etched as well as portions of the undermost masking layer.

Referring now more specifically to the drawings, wherein the showings are for the purposes of illustrating the preferred embodiments of the invention only and not for purposes of limiting same, FIGS. 1(a)–(f) provide an illustration of a first embodiment of the invention. FIGS. 1(a)–(f) show, as an example, fabrication of a pressure swirl atomizer.

Figure 5:
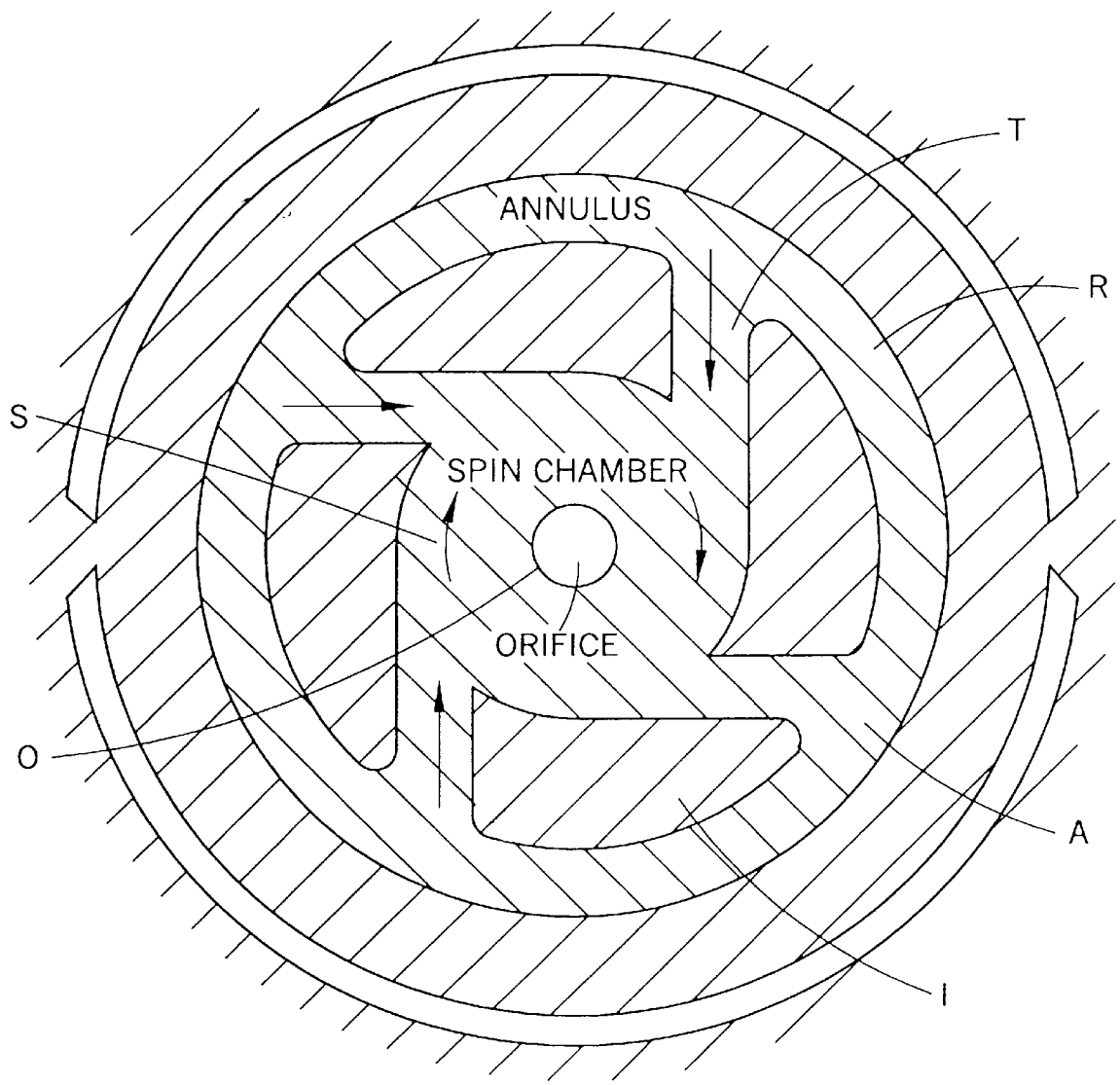

An exemplary atomizer is illustrated in FIG. 5. As shown, the atomizer comprises a raised outer ridge R and raised islands I that define an annulus A and spin chamber S. Also defined by the islands I are tangential slots T. An orifice O is further formed in the atomizer. In operation, fuel enters the spin chamber S through the tangential slots T and swirls therein. The fuel then exits the spin chamber S by way of the orifice O in a hollow conical spray.

It should be recognized that the atomizer is only representative of the types of devices that can be made using the present molding process. Any device that is on a microscale, and needs to be made from a mold, can be made using the processes of the embodiments described herein. It should also be recognized that, although numerical values for specifications such as thickness and etch depth are recited in describing the methods of the present invention, the values may vary according to application.

Figure 1A:
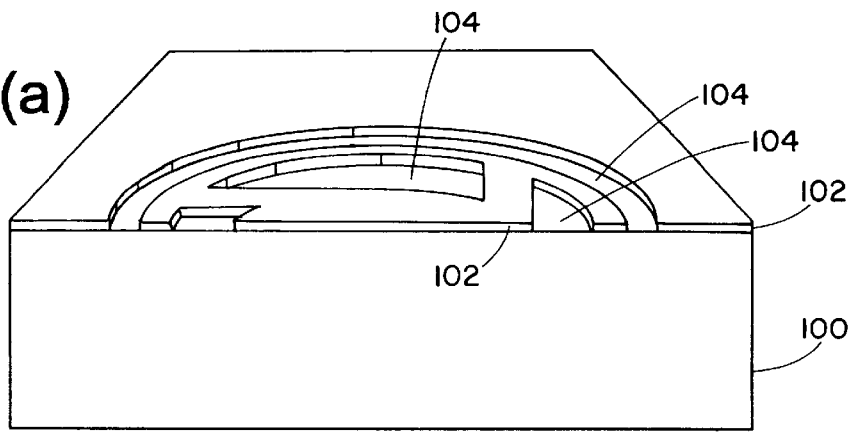
FIGS. 1(a)–(f) illustrate a process according to a first embodiment of the present invention.
Figure 1B:
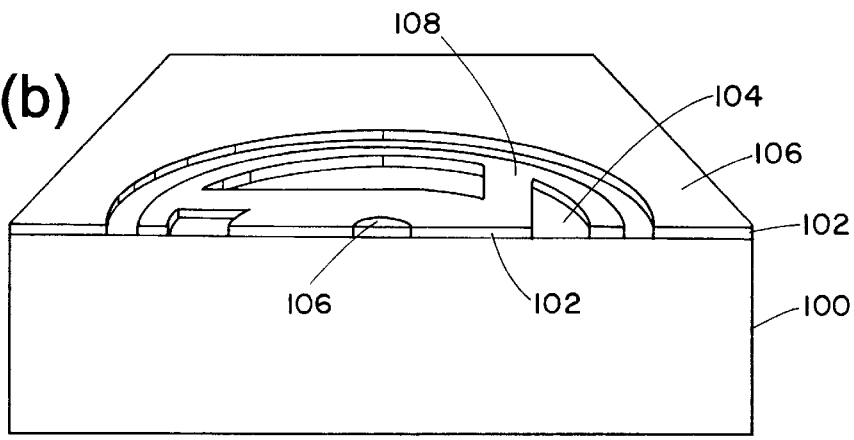

As shown in FIGS. 1(a)–(f), the first embodiment of the present invention begins with a 1 μm thick growth of silicon dioxide on the substrate wafer 100 to form the first mask layer 102 (FIG. 1(a)). The silicon dioxide is patterned using a standard photolithographic process to define areas, or portions, exemplary shown at 104 corresponding to that which will be the deepest etched areas of the mold, which mold areas define the outer annulus, inlet slots, and the swirl chamber of the atomizer. This is followed by spinning on and patterning of a photoresist (AZ 4620) layer 106, or second masking layer, to define areas, or portions, exemplary shown at 108 having only the first masking layer thereon and corresponding to that which will be the shallower etched areas of the mold (FIG. 1(b)). The areas with both layers of masking disposed thereon correspond to the unetched areas, e.g. the area corresponding to the exit orifice.

Figure 1C:
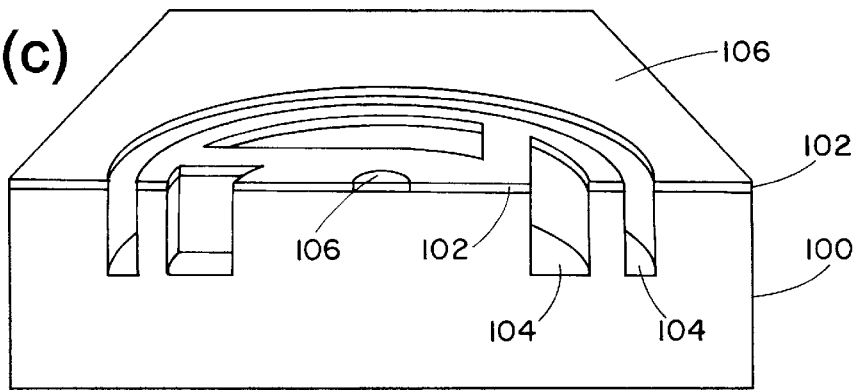
Figure 1D:
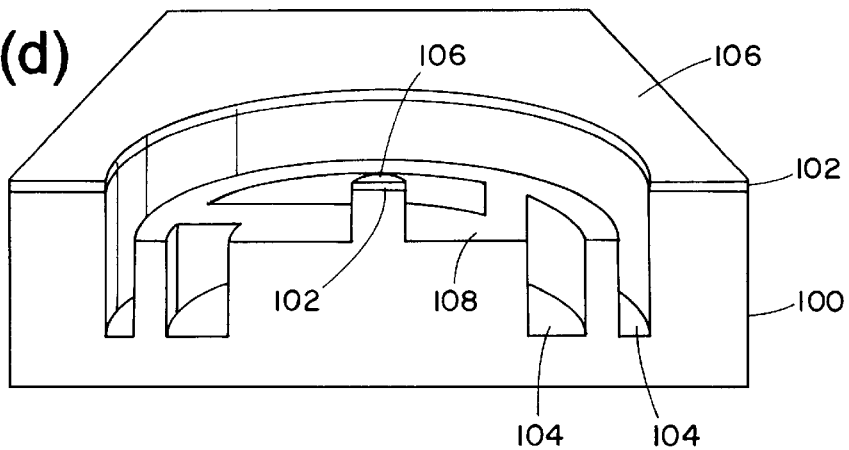
Figure 1E:
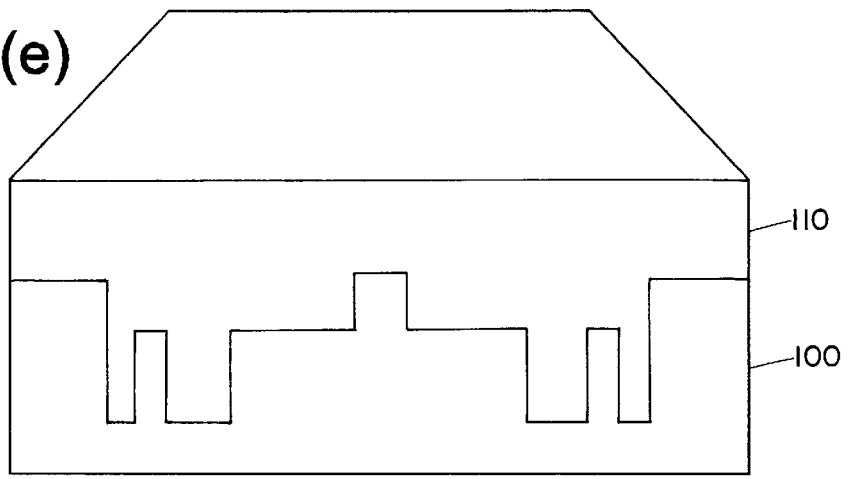
Figure 1F:
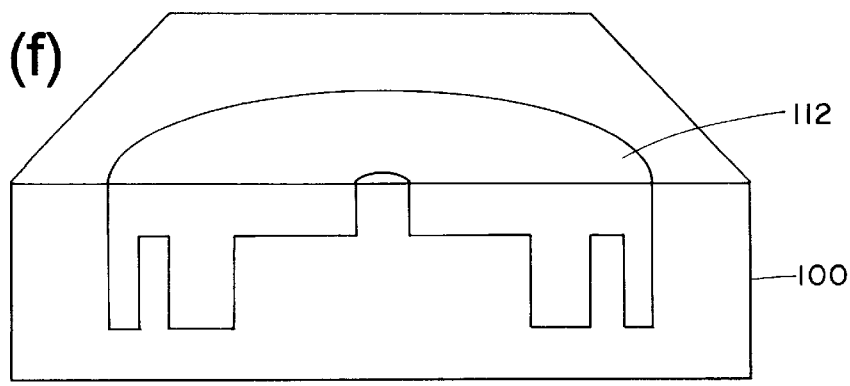

Once the two layers are patterned, the next step is the primary etch which defines that which will ultimately be the deepest parts of the mold (FIG. 1(c)) to form an intermediate or first mold pattern. In this case, the substrate is selectively etched according to the pattern to a depth of 275 μm, as this is the height of the swirl chamber wall in a standard microcromachined atomizer. The exposed portions of the oxide layer 102 are then cleared using buffered HF (FIG. 1(d)). This is followed by the secondary etch (defining a second mold pattern) to the next deepest part of the mold, a depth of 125 μm, which is the length of the exit orifice (FIG. 1(d)). Of course, the second etch etches the areas shown at 108 down to the second deepest part of the mold and the areas shown at 104 down to the deepest, a depth of 400 μm, to form the finished mold pattern. It should be apparent to those skilled in the art that the second mold pattern encompasses and adjoins the first mold pattern to form the final or finished mold pattern. The photoresist layer 106 is then removed using Piranha. The remaining portions of the silicon dioxide layer 102 are also removed.

Another aspect of this process is the deposition and finishing of the components. In this regard, approximately 400 μm of silicon carbide 110 is deposited into the mold using methyltrichlorosilane (MTS) at a temperature of 1200 degrees Celsius using a chemical vapor deposition (CVD) process (FIG. 1 (e)). The deposition occurs not only in the mold but over the entire substrate. Therefore, it is necessary to lap and polish the excess SiC off the substrate until the top of the filled mold is flush with the top of the substrate (FIG. 1(f)). For this process, the lapping is preferably accomplished using a 15 μm polycrystalline diamond suspension on a cast iron polishing plate to remove the bulk of the silicon carbide, then finish the surface with a 1 μm suspension to achieve a smoother finish. After the finishing polish, the mold 100 (Si substrate) is released, or etched away, in a potassium hydroxide (KOH) solution at elevated temperatures, e.g. 55 degrees Celsius, leaving behind only the SiC device 112. Other solutions can also be used to etch away the mold material, for example, EDP(ethylenediaminepyrocatechol), TMAH(tetramethylammonium hydroxide), or HNA(hydrofloric acid, nitric acid, acetic acid).

As with the first embodiment, the approach of the second embodiment is to deposit and pattern all etch masking layers before any of the etching takes place. However, in a second embodiment illustrated in FIGS. 2(a)–(e), the deepest etch is defined by the top-most masking layer, as it is used first, and then removed. The next etch is performed using the next masking layer, etching the area exposed by that masking layer after the removal of the top-most masking layer. It follows from the above description that the top-most masking layer exposes the least amount of the substrate to be etched. It covers the other masking layer plus additional areas of the substrate that are exposed by the other masking layer.

Referring now to FIGS. 2(a)–(e), a description for the fabrication of another mold for pressure-swirl atomizers is illustrated to give a further specific example of the use of the present process. The process starts with thick oxide growth on the substrate wafer to form the first mask layer 202 (FIG. 2(a)). The oxide is patterned using a standard photolithographic process to define areas exemplary shown at 204 corresponding to what will be the deepest etched areas of the mold, which are the mold areas defining the outer annulus, inlet slots, and the swirl chamber. This is followed by spinning on and patterning 10 μm thick resist (AZ 4620) layer 206 to define areas exemplary shown at 208 corresponding to what will be the shallower etched areas of the mold (FIG. 2(b)).

Figure 2A:
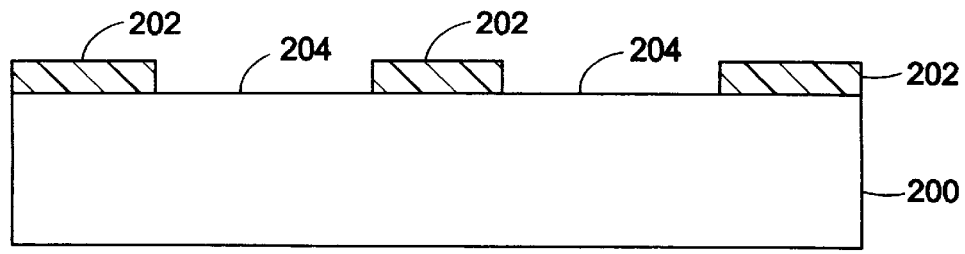
FIGS. 2(a)–(e) illustrate a process according to a second embodiment of the present invention.
Figure 2B:
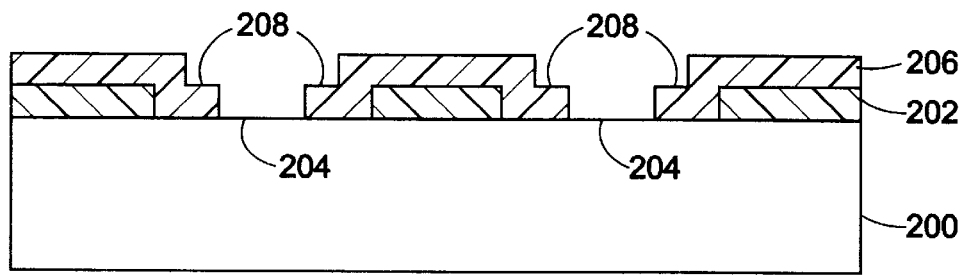
Figure 2C:
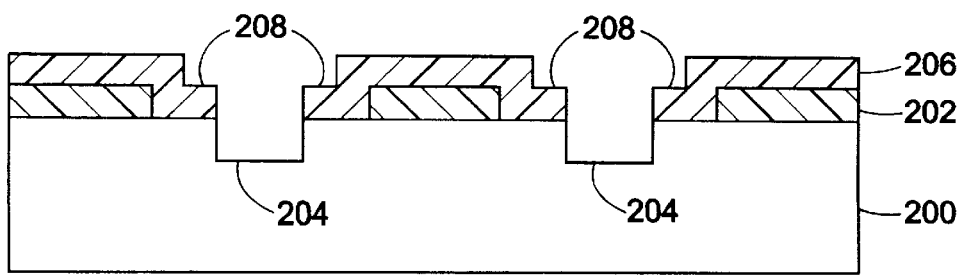
Figure 2E:
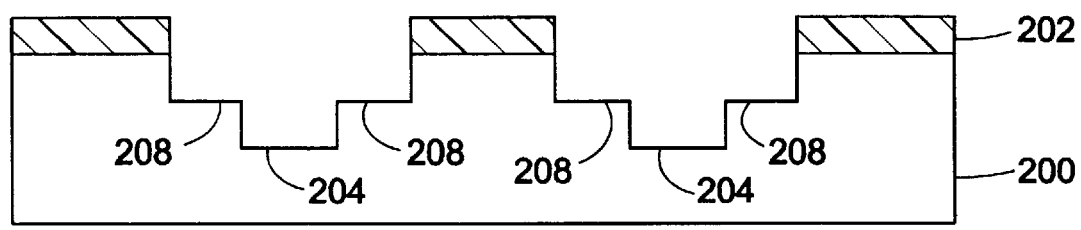
Figure 2F:
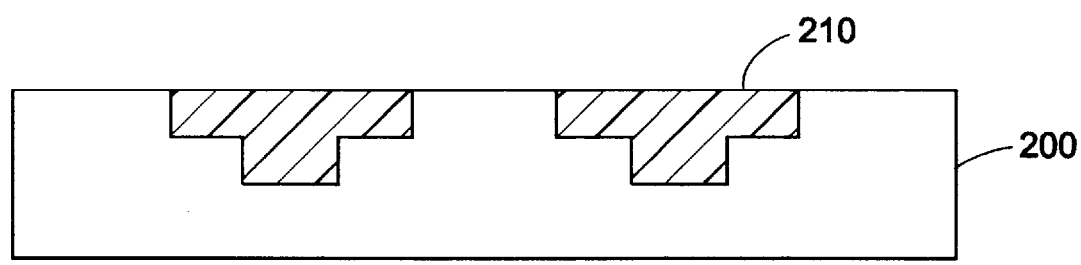

Once the two layers are patterned, the next step is the primary etch which defines the deepest parts of the mold (FIG. 2(c)). In this case it is etched to a depth of 275 μm, as this is the height of the swirl chamber wall in a standard Si microcromachined atomizer to create an intermediate or first mold pattern. The resist pattern 206 is then cleared using a Piranha etch (FIG. 2(d)). This etch does not effect the oxide layer 202 as it is impervious to Piranha. This is followed by the secondary etch (defining a second mold pattern) to the next deepest part of the mold, a depth of 125 μm, which is the length of the exit orifice, to create a finished mold pattern (FIG. 2(d)). It should be apparent to those skilled in the art that the second mold pattern encompasses and adjoins the first mold pattern to form the final or finished mold pattern. The oxide layer 202 is then removed (FIG. 2(e)).

Another aspect of this process is the deposition and finishing of the components. In this regard, approximately 400 μm of silicon carbide 210 is deposited into the mold by the CVD process described in connection with FIG. 1(e). The deposition occurs not only in the mold but over the entire substrate. Therefore, although not shown, it is necessary to lap and polish the excess SiC off the substrate until the top of the filled mold is flush with the top of the substrate (FIG. 2(e)). For this process, the lapping is preferably accomplished using a coarse diamond suspension to remove the bulk of the silicon carbide. Then, the surface is polished with a 1 μm suspension to achieve a smoother finish. After the finishing polish, the mold 200 (Si substrate) is etched away in a potassium hydroxide solution at elevated temperatures, leaving behind only the SiC device 210. Other solutions can also be used to etch away the mold material, for example, EDP, TMAH, or HNA.

With respect to the processes described in FIGS. 1(a) through 2(e), it was found that the high rate deposition process used for depositing silicon carbide in the mold left protrusions of silicon carbide in the final device, caused by pitting of the Si mold during the deposition of the silicon carbide. To overcome this problem, a thin (1.5 μm) single crystal film of silicon carbide, which does not pit the substrate, is preferably first deposited. This film is impervious to pitting during the high deposition rate process. With reference to the figures, prior to steps shown in FIGS. 1(e) and 2(e), the thin film of silicon carbide is deposited.

It is also to be appreciated that other materials, such as castable ceramic, silicon nitride, nickel or plastics, can also be used to fill the molds given the ability to find apparatus with the ability to deposit the materials to the requisite thickness. As such, the mold filler can be any material that can sustain high deposition rates on Si substrate.

The embodiments described in FIGS. 1(a) through 2(e) involve use of a mold for the fabrication of only a single part. That is, these molds are not reusable. However, a process involving a reusable mold according to a third embodiment of the present application is illustrated in FIGS. 3(a)–(f). This process involves chemical vapor deposition (CVD) or other methods to form the molded part. These methods enable molding of parts formed of silicon carbide, castable ceramics, plastics and other materials that can be deposited onto sacrificial layers. It should be recognized that the processes described in connection with FIGS. 3(a)–(f), as well as the processes described in connection with FIGS. 4(a)–(g), are applicable to micromachined atomizers and other specific configurations, although the drawings show a more generic representation.

Figure 3A:
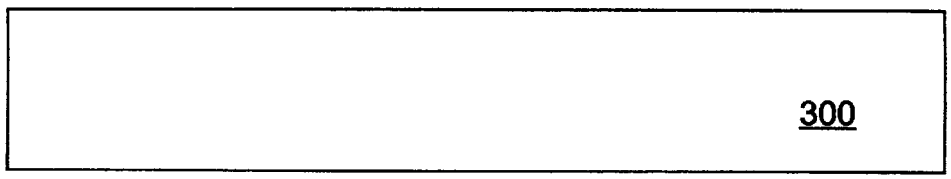
FIGS. 3(a)–(f) illustrate a process according to a third embodiment of the present invention.
Figure 3B:
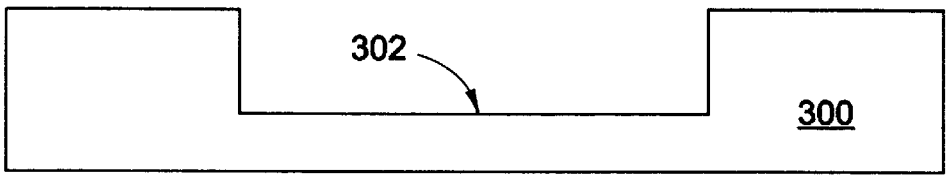

As shown, a silicon wafer 300 is provided (FIG. 3(a)). Next, a mold pattern 302 is etched out of the wafer 300 (FIG. 3(b)) to form a mold. It is to be appreciated that the pattern 302 may be formed by a variety of methods, including those described in connection with FIG. 1(a)–(d) and 2(a)–(d), to form a variety of molds.

Figure 3C:
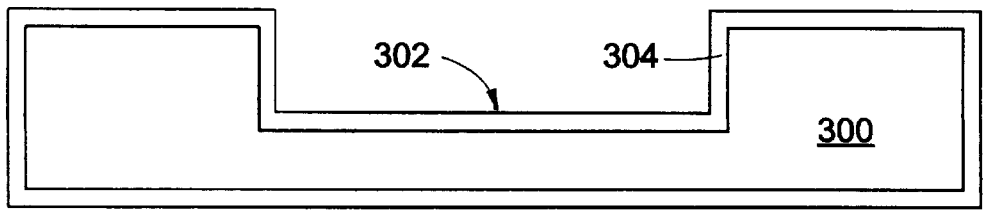
Figure 3D:
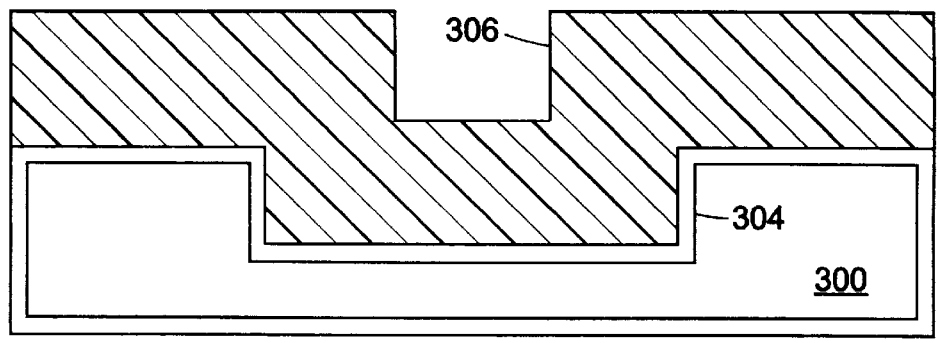
Figure 3E:
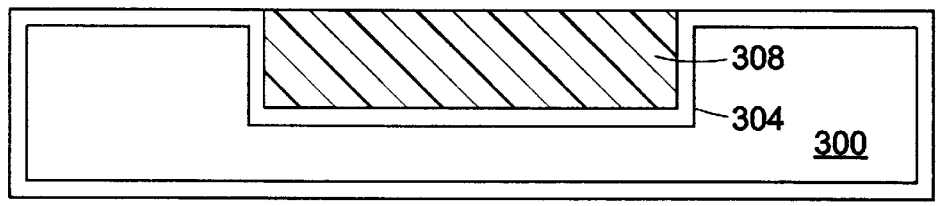
Figure 3F:
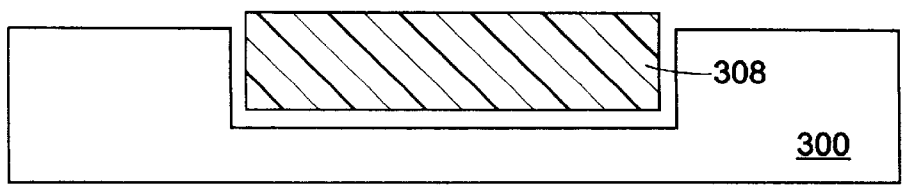

A conformal sacrificial layer 304 is then formed around the silicon wafer 300 having the etched mold pattern 302 (FIG. 3(c)). The preferred sacrificial layer is silicon dioxide formed by deposition, although any suitable sacrificial layer will suffice so long as the etched mold features in the pattern 302 are not affected. A material, e.g. silicon carbide, 306 is then deposited by a CVD process to fill the mold pattern (FIG. 3(d)). As a consequence of the deposition process, excess material may be deposited. Preferably, the deposited material should be the material of which the part is formed. Any excess deposited material 306 is removed to create a molded part 308 having a flat surface and to expose the sacrificial layer 304 (FIG. 3(e)). The sacrificial layer 304 is then dissolved to release the molded part 308 (FIG. 3(f)).

The mold—comprised of the wafer 300 and the etched out mold pattern 302—can then be reused to fabricate additional molded parts. To that end, the steps of the process corresponding to FIG. 3(c)–(f) are repeated.

FIG. 4 illustrates another process according to a fourth embodiment of the present invention that makes use of a reusable mold in the context of a process to form a molded part by plating. As illustrated, a silicon wafer 400 is provided (FIG. 4(a)). A mold pattern 402 is then etched out of the wafer 400 (FIG. 4(b)). It is to be appreciated that the pattern 402 may be formed by a variety of methods, including those described in connection with FIGS. 1 (a)–(d) and 2(a)–(d), to form a variety of molds.

Figure 4A:
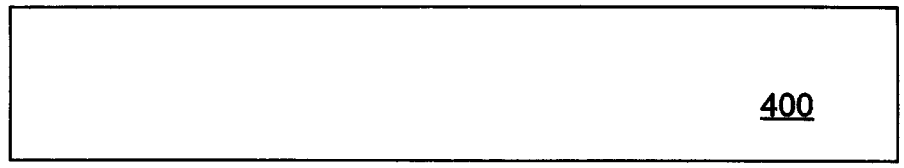
FIGS. 4(a)–(g) illustrate a process according to a fourth embodiment of the present invention; and, FIG. 5 is a top view of an atomizer.
Figure 4B:
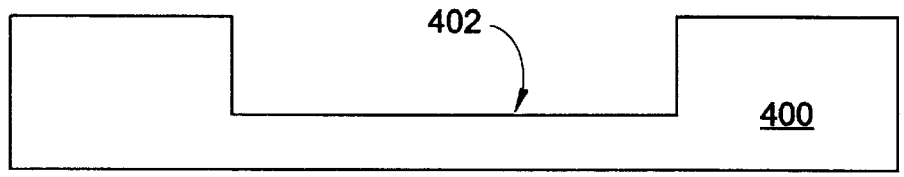
Figure 4C:
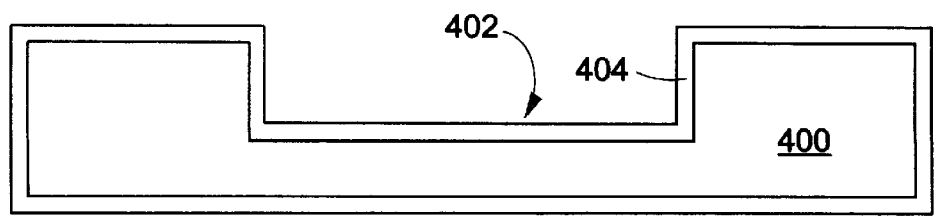
Figure 4D:
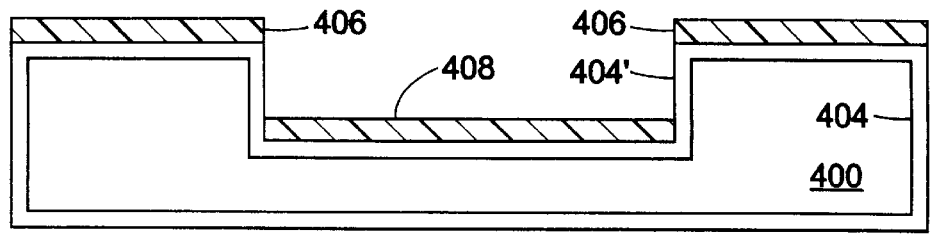
Figure 4E:
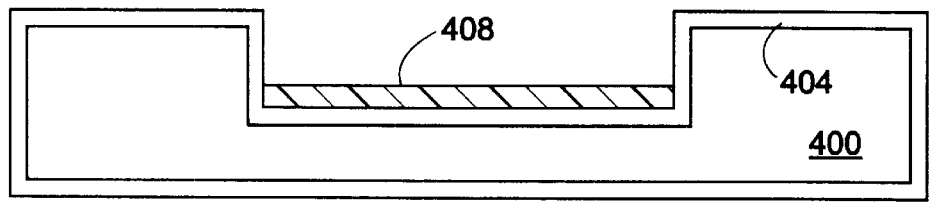
Figure 4F:
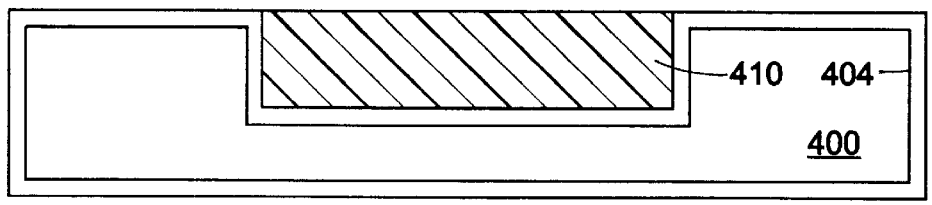
Figure 4G:
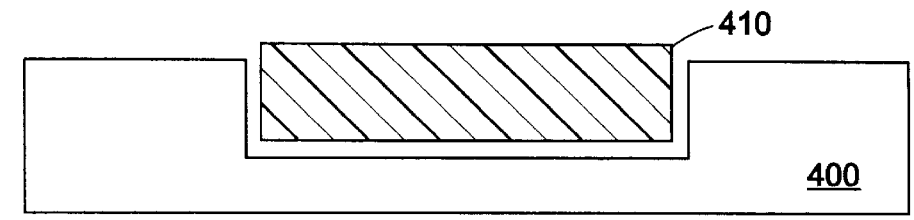

A conformal sacrificial layer 404 is formed around the wafer 400 having the etched mold pattern 402 (FIG. 4(c)). Plating, or seed, layers 406 and 408 are formed by either sputtering or evaporation so that there will be little or no side wall coating on the side walls 404' (FIG. 4(d)). The seed layers 406 on the higher elevations of the mold are then removed by polishing (FIG. 4(e)), leaving seed layer 408. Electrolytic plating is then performed on the seed layer 408 to fill the mold features of mold pattern 402 to form a part 410 (FIG. 4(f)). It should be appreciated that some polishing may be needed to obtain a flat surface on part 410. Possible topography may also need to be removed at the side wall locations. Sacrificial layer 404 is then dissolved to free the molded part 410 (FIG. 4(g)).

It should be recognized that the thin metal seed layer 408 may or may not be of the same material as the plated metal part 410. If the seed layer 408 is of a different material then the molded part 410, it can be removed subsequent to the part 410 being released by the chemical etching of sacrificial layer 404.

Accordingly, similar to the process shown in FIGS. 3(a)–(f), the mold may be reused to form additional parts. In this regard, steps shown in FIGS. 4(c)–(g) are implemented.

Another micromolding technique according to the present invention involves the use of ceramic pastes, available for a wide range of high temperature ceramics (e.g. aluminum oxide, silicon carbide), to fill the molds and fabricate high temperature parts. This technique could be used with any of the above described embodiments to replace the depositing (e.g. CVD) or plating of the material used to form the parts.

The advantage of the use of the ceramic paste is two-fold:
1) The application of the paste into the mold is a low temperature, low cost process. It does not require a controlled reactor environment with controlled gas flow.

2) The curing of the ceramic paste is also, relative to CVD processes, a low temperature process. The final device, when released, is often capable of exceeding 1000° C.

The paste is applied into the mold. Due to the small nature of the channels and grooves of the mold, this sometimes requires the use of a wetting agent to ensure that the paste adequately fills the mold. Once the mold is filled, the paste is left to cure without regard to the planarity of the filler with the top surface of the mold. However, once the paste has cured in the mold, the excess paste is mechanically polished until the entire mold/paste substrate is planar. The final step is the release of the molded device in either KOH, EDP, TMAH or HNA.

The above description merely provides a disclosure of particular embodiments of the invention and is not intended for the purpose of limiting the same thereto. As such, the invention is not limited to only the above described embodiments. Rather, it is recognized that one skilled in the art could conceive alternative embodiments that fall within the scope of the invention.

What is claimed is:

1. A method for molding a high precision component comprising steps of:
    depositing and patterning a first mask layer of a non-photoresist material on a substrate defining a deepest part of a final mold pattern in the substrate;
    depositing and patterning a second mask layer of a photoresist material on the first mask layer defining a shallower part of the final mold pattern such that first portions of the first mask layer and first portions of the substrate are left exposed;
    performing a first etch process to etch the first portions of the substrate to form a first mold pattern in the substrate corresponding to the deepest part of the final mold pattern;
    removing the first portions of the first mask layer to expose second portions of the substrate while retaining the second mask layer on remaining portions of the first mask layer;
    performing a second etch process to etch the second portions of the substrate to form a second mold pattern in the substrate corresponding to the shallower part of the final mold pattern, wherein the second mold pattern encompasses and adjoins the first mold pattern to thereby define the final mold pattern in the substrate;
    removing the second mask layer and the remaining portions of the first mask layer;
    depositing a filler material into the final mold pattern of the substrate such that depositing occurs over a top surface of the entire substrate;
    lapping and polishing the filler material flush to the top surface of the substrate; and, releasing the polished filler material from the substrate to provide the high precision component.

2. The method of claim 1 wherein the filler material is silicon carbide and the method further comprises the step of forming a thin film coating of silicon carbide in the final mold pattern before the depositing.

3. A method for molding a high precision component comprising the steps of:
    depositing and patterning a first mask layer of a non-photoresist material on a substrate defining a shallowest part of a final mold pattern in the substrate;
    depositing and patterning a second mask layer of a photoresist material on the first mask layer and the substrate defining a deeper part of the final mold pattern such that the second mask layer completely covers the first mask layer and leaves first portions of the substrate exposed;
    performing a first etch process to etch the first portions of the substrate to form a first mold pattern in the substrate corresponding to the deeper part of the final mold pattern;
    removing the second mask layer to expose the first mask layer and second portions of the substrate;
    performing a second etch process to etch the first and second portions of the substrate to form a second mold pattern in the substrate corresponding to the shallowest and deeper part of the final mold pattern, wherein the second mold pattern encompasses and adjoins the first mold pattern to thereby define the final mold pattern in the substrate;
    removing the first mask layer;
    depositing a filler material into the final mold pattern of the substrate such that depositing occurs over a top surface of the entire substrate;
    lapping and polishing the filler material flush to the top surface of the substrate; and,
    releasing the polished filler material from the substrate to provide the high precision component.

4. The method of claim 3 wherein the filler material is silicon carbide and the method further comprises the step of forming a thin film coating of silicon carbide in the final mold pattern before the depositing.

5. A method for molding high precision components comprising steps of:
    (a) depositing and patterning a first mask layer of a non-photoresist material on a substrate defining a deepest part of a final mold pattern in the substrate;
    (b) depositing and patterning a second mask layer of a photoresist material on the first mask layer defining a shallower part of the final mold pattern such that first portions of the first mask layer and first portions of the substrate are left exposed;
    (c) performing a first etch process to etch the first portions of the substrate to form a first mold pattern in the substrate corresponding to the deepest part of the final mold pattern;
    (d) removing the first portions of the first mask layer to expose second portions of the substrate while retaining the second mask layer on remaining portions of the first mask layer;
    (e) performing a second etch process to etch the second portions of the substrate to form a second mold pattern in the substrate corresponding to the shallower part of the final mold pattern, wherein the second mold pattern encompasses and adjoins the first mold pattern to thereby define the final mold pattern in the substrate;
    (f) removing the second mask layer and the remaining portions of the first mask layer to obtain a mold comprising the substrate having formed in a top surface thereof a pattern corresponding to the final mold pattern of the substrate;
    (g) forming a sacrificial layer around the mold;
    (h) depositing filler material into areas of the mold corresponding to the pattern such that depositing occurs over the entire top surface of the mold;
    (i) removing excess filler material to expose portions of the sacrificial layer on the top surface of the mold and leave filler material only in the bottom surface of the pattern;
    (j) dissolving the sacrificial layer to release the filler material from the mold as a molded high precision component; and,
    (k) repeating steps (g) through (j) to form additional molded high precision components.

6. A method for molding high precision components comprising steps of:

(a) depositing and patterning a first mask layer of a non-photoresist material on a substrate defining a deepest part of a final mold Pattern in the substrate;

(b) depositing and patterning a second mask layer of a photoresist material on the first mask layer defining a shallower part of the final mold pattern such that first portions of the first mask layer and first portions of the substrate are left exposed;

(c) performing a first etch process to etch the first portions of the substrate to form a first mold pattern in the substrate corresponding to the deepest part of the final mold pattern;

(d) removing the first portions of the first mask layer to expose second portions of the substrate while retaining the second mask layer on remaining portions of the first mask layer;

(e) performing a second etch process to etch the second portions of the substrate to form a second mold pattern in the substrate corresponding to the shallower part of the final mold pattern, wherein the second mold pattern encompasses and adjoins the first mold pattern to thereby define the final mold pattern in the substrate;

(f) removing the second mask layer and the remaining portions of the first mask layer to obtain a mold comprising the substrate having formed in a top surface thereof a pattern corresponding to the final mold pattern of the substrate;

(g) forming a sacrificial layer around the mold;

(h) forming seed layers into areas of the mold corresponding to a bottom surface of the pattern and the top surface of the mold;

(i) removing the seed layers formed on the top surface thereby leaving the seed layer only in the pattern;

(j) plating a filler material on the seed layer to fill the pattern such that plating occurs over the entire top surface of the mold;

(k) polishing excess filler material;

(l) dissolving the sacrificial layer to release the filler material from the mold as a molded high precision component; and, (m) repeating steps (g) through (l) to form additional molded high precision components.

7. A method for molding high precision components comprising the steps of:

(a) depositing and patterning a first mask layer of a non-photoresist material on a substrate defining a shallowest part of a final mold pattern in the substrate;

(b) depositing and patterning a second mask layer of a photoresist material on the first mask layer and the substrate defining a deeper part of the final mold pattern such that the second mask layer completely covers the first mask layer and leaves first portions of the substrate exposed;

(c) performing a first etch process to etch the first portions of the substrate to form a first mold pattern in the substrate corresponding to the deeper part of the final mold pattern;

(d) removing the second mask layer to expose the first mask layer and second portions of the substrate;

(e) performing a second etch process to etch the first and second portions of the substrate to form a second mold pattern in the substrate corresponding to the shallowest and deeper part of the final mold pattern, wherein the second mold pattern encompasses and adjoins the first mold pattern to thereby define the final mold pattern in the substrate;

(f) removing the first mask layer to obtain a mold comprising the substrate having formed in a top surface thereof a pattern corresponding to the final mold pattern of the substrate;

(g) forming a sacrificial layer around the mold;

(h) depositing filler material into areas of the mold corresponding to the pattern such that depositing occurs over the entire top surface of the mold;

(i) removing excess filler material to expose portions of the sacrificial layer on the top surface of the mold and leave filler material only in the bottom surface of the pattern;

(j) dissolving the sacrificial layer to release the filler material from the mold as a molded high precision component; and, (k) repeating steps (g) through (j) to form additional molded high precision components.

8. A method for molding high precision components comprising the steps of:

(a) depositing and patterning a first mask layer of a non-photoresist material on a substrate defining a shallowest part of a final mold pattern in the substrate;

(b) depositing and patterning a second mask layer of a photoresist material on the the first mask layer and the substrate defining a deeper part of the final mold pattern such that the second mask layer completely covers the first mask layer and leaves first portions of the substrate exposed;

(c) performing a first etch process to etch the first portions of the substrate to form a first mold pattern in the substrate corresponding to the deeper part of the final mold pattern;

(d) removing the second mask layer to expose the first mask layer and second potions of the substrate;

(e) performing a second etch process to etch the first and second portions of the substrate to form a second mold pattern in the substrate corresponding to the shallowest and deeper part of the final mold pattern, wherein the second mold pattern encompasses and adjoins the first mold pattern to thereby define the final mold pattern in the substrate;

(f) removing the first mask layer to obtain a mold comprising the substrate having formed in a top surface thereof a pattern corresponding to the final mold pattern of the substrate;

(g) forming a sacrificial layer around the mold;

(h) forming seed layers into areas of the mold corresponding to a bottom surface of the pattern and the top surface of the mold;

(i) removing the seed layers formed on the top surface thereby leaving the seed layer only in the pattern;

(j) plating a filler material on the seed layer to fill the pattern such that plating occurs over the entire top surface of the mold;

(k) polishing excess filler material;

(i) dissolving the sacrificial layer to release the filler material from the mold as a molded high precision component; and, (m) repeating steps (g) through (i) to form additional molded high precision components.

* * * * *